United States Patent

Matloubian et al.

[11] Patent Number: 5,854,086
[45] Date of Patent: Dec. 29, 1998

[54] METHOD FOR MANUFACTURING PLANAR FIELD EFFECT TRANSISTORS AND PLANAR HIGH ELECTRON MOBILITY TRANSISTORS

[75] Inventors: Mehran Matloubian, Encino; Jeffrey B. Shealy, Thousand Oaks, both of Calif.

[73] Assignee: Hughes Electronics Corporation, El Segundo, Calif.

[21] Appl. No.: 697,231

[22] Filed: Aug. 21, 1996

[51] Int. Cl.⁶ .......................... H01L 21/66; H01L 21/28; H01L 21/44; G01R 31/26
[52] U.S. Cl. .......................... 438/18; 438/571; 438/577
[58] Field of Search .......................... 438/571, 577, 438/576, 18

[56] References Cited

U.S. PATENT DOCUMENTS

| | | | |
|---|---|---|---|
| 5,038,187 | 8/1991 | Zhou | 357/22 |
| 5,053,348 | 10/1991 | Mishra et al. | 437/41 |
| 5,646,069 | 7/1997 | Jelloian et al. | 437/184 |

OTHER PUBLICATIONS

Bahl, Sandeep R., et al. "*Elimination of Mesa–Sidewall Gate Leakage in InAlAs/InGaAs Heterostructures by Selective Sidewall Recessing,*" Apr., 1992 IEEE Electron Device Leters, vol. 13, No. 4, pp. 195–197.

Bahl, Sandeep R. et al.., "*Mesa–Sidewall Gate Leakwage in InAlAs/InGaAs Heterostructure Field–Effect Transistors*" Sep., 1992, IEEE Transactions on Electron Devices, vol. 39, No. 9, pp. 2037–2043.

*Primary Examiner*—Brian Dutton
*Attorney, Agent, or Firm*—V. D. Duraiswamy; W. K. Denson-Low

[57] ABSTRACT

An apparatus and method of processing a planar HEMT or FET semiconductor device is disclosed. An ohmic metalization is patterned on a semiconductor surface then lifted-off. A plurality of process control monitors are isolated, preferably using a wet etch process. The process control monitors preferably include transmission line patterns (TLMs) and etch field effect transistors The TLMs measure the contact resistance during the ohmic alloy process, and the etch field effect transistors monitor the drain current during the gate-recess step. The ohmic metalizations are then alloyed, and a gate is written using an electron beam. The semiconductor device is isolated, followed by application of an overlay which connects all resulting planar device connecting pads.

7 Claims, 1 Drawing Sheet

METHOD FOR MANUFACTURING PLANAR FIELD EFFECT TRANSISTORS AND PLANAR HIGH ELECTRON MOBILITY TRANSISTORS

GROUND OF THE INVENTION

1. Field of the Invention

The present invention generally relates to high electron mobility transistors (HEMTs) and field effect transistors (FETs). More specifically it relates to a method and apparatus for planar HEMT's or planar FET's having high isolation characteristics.

2. Description of the Related Art

An important step in the fabrication of integrated circuits is to provide electrical isolation between the device components. Ion implantation and mesa isolation are two common processes used for fabricating and isolating integrated circuit devices containing FETs and HEMTs.

In conventional ion-implantation techniques, energetic ions are implanted directly into a semiconductor substrate. Device isolation is achieved by first protecting the active region of the device with a photoresist, then selectively bombarding the remaining unprotected regions of the wafer with high-energy ions (e.g. boron). After an ohmic pattern is formed, isolation ions are implanted, the ohmic pattern is alloyed, and a gate is written via an electron beam. The perimeter is then etched, and a final overlay is provided.

Achieving device isolation can be difficult when using ion-implantation as the manufacturing process, particularly for devices having low band gap channels (e.g. InGaAs). Increased doses of ions are used in an attempt to provide heightened isolation characteristics. High ion doses, however, harden the photoresist that protects the active regions of the device, thereby making it difficult to remove the protective photoresist and clean the resist residue after implant. Ion implantation uses solvents or photoresist strippers to clean the hardened resist etch and rough up the semiconductor surface. The problem of removing hardened photoresist is particularly troublesome in manufacturing FET's because the gate is not written until after ion implantation occurs and therefore must be written over resist residue. The etched or roughened surface makes it difficult to efficiently write a gate. Consequently, the difficulty in etching the residue reduces manufacturing yield, reduces gate yield and degrades device performance. The resulting semiconductor wafer is likely to possess non-uniform and inadequate electrical characteristics such as varying pinch-off voltages. In addition, high isolation is difficult to achieve in devices manufactured via the ion implantation process, particularly HEMT's with very low bandgap channels. For example, an ion implanted HEMT device will typically have an isolation less than 6 mega-ohms. Another drawback of ion implantation is that the process demands capital-intensive equipment.

In conventional mesa isolation techniques, isolation is achieved by first photoresist masking the active region of the wafer and then etching the remaining exposed semiconductor. Unlike ion-implantation, the mesa isolation fabrication etch occurs before the electron beam gate is written resulting in high device isolation typically exceeding 6 mega-ohms.

Mesa isolation, however, creates devices having non-planar metalizations, resulting in the need for interconnect pads that reside on a variety of semiconductor levels. Consequently, the fabricated mesa device has metal interconnect lines running adjacent to the mesa sidewall. Aside from being difficult to manufacture, these micron sized interconnect lines (typically 0.1 micron wide) can have discontinuities running up the side of the mesa sidewall.

Another source of problems in the mesa process is that it achieves device isolation by first protecting the active region of a devices then etching away the excess material As disclosed in Bahl et al., "Mesa-Sidewall Gate Leakage in InAlAs/InGaAs Heterostructure Field Effect Transistors," IEEE Transactions on Electron Devices, Vol. 39, No. 9, September 1992, pages 2037-2043, gate fingers which cross the mesa edge and come in contact with the edge of a low band-gap channel cause significant increases in the gate finger leakage of the device. The low Schottky barrier height of metals on InAlAs potentially results in a sidewall parasitic leakage path from the gate to the channel. This sidewall leakage results in excessive forward and reverse gate leakage currents, increased sub-threshold currents, reduced breakdown voltage, and increased sidegating.

The gate leakage associated with mesa fabricated devices can be reduced by using selective enchants to undercut or "etch-back" the channel. However, this process is not a high yield process that can be performed uniformly and repeatedly across a wafer and/or from wafer to wafer. For example, a channel on one device may be undercut or "etched-back" much more than a channel on another device on the same wafer, thereby resulting in varying electrical performances of similar devices on one common wafer.

With the mesa process, it is also difficult to pattern very short gate lengths particularly when using an electron beam to write the gate over the mesa edge. This problem is due to the non-uniformity of the thickness of the electron beam ultra violet resist poly-methyl methacrylate (PMMA) which is spun on the wafer prior to writing the gate.

Thus, there is a need for a semiconductor device manufacturing method that provides a method of fabricating a HEMT or FET that results in planar metalizations (i.e. connecting pads), high device isolation, increased manufacturing yield, elimination of ion implantation, lowering of device gate leakage current, increased breakdown voltage, and lower manufacturing costs.

SUMMARY OF THE INVENTION

The present invention provides a method for fabricating a HEMT or FET that results in planar metalizations (i.e. connecting pads), high device isolation, increased manufacturing yield, elimination of ion implantation, lowering of device gate leakage current, increased breakdown voltage, and lower manufacturing costs. The method of the present invention further achieves planar FET or HEMT structures without the need for ion-implantation. According to the present invention, an ohmic metalization is patterned on a semiconductor surface then lifted-off. A plurality of process control monitors are then isolated, preferably using a wet etch process. The process control monitors include transmission line patterns (TLMs) and etch FETs. The TLMs measure the contact resistance during the ohmic alloy process The etch FETs monitor the drain current during the gate-recess step. The ohmic metalizations are then alloyed, and a gate is written using an electron beam. The semiconductor device is isolated and finally an overlay is provided These and other features and advantages of the present invention will be apparent to those skilled in the art from the following detailed description, taken together with the accompanying flowchart

DETAILED DESCRIPTION OF THE INVENTION

Figure 1:
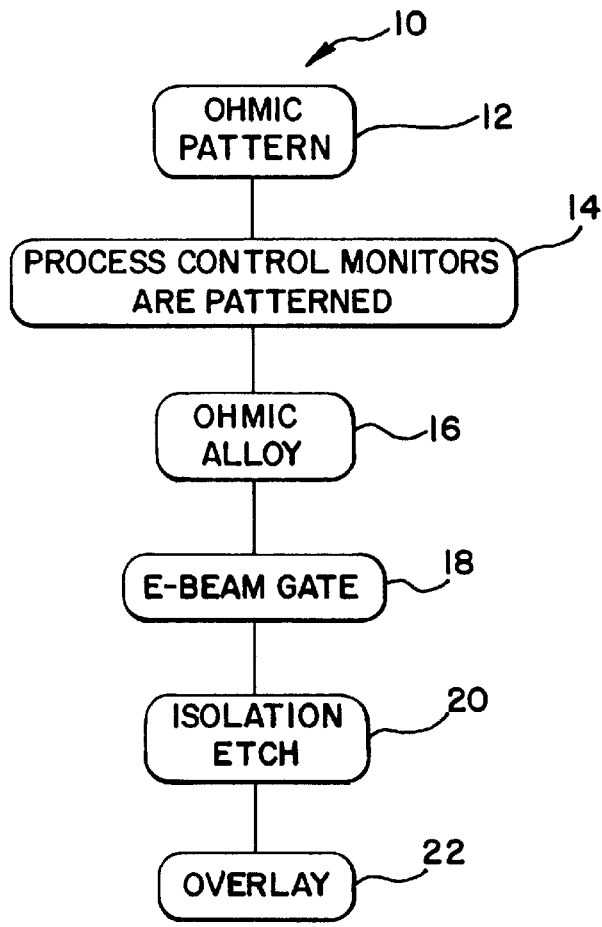
FIG. 1 is a flowchart illustrating a preferred method embodying the present invention which may be used to fabricate a HEMT or FET.

FIG. 1 is a flowchart illustrating the preferred method 10 for fabricating a FET or HEMT planar device according to the method of the present invention. The disclosed method can be used in the manufacturing of any type of FET, preferably a GaAs or an InP based FET. As illustrated, the manufacturing process begins by defining an ohmic pattern or a metalization pattern on the semiconductor 12. During this step, the source and drain metal-semiconductor junctions for the device are patterned. The wafer is placed in a vacuum chamber. The vacuum is lowered and then various techniques are employed to evaporate the metal. These various techniques include the use of an electron beam (e-beam) evaporator or a thermal evaporator. Preferably an electron beam gun evaporator is used since it results in a cleaner manufacturing process than other evaporation processes.

Preferably, a metal liftoff process where a photoresist is optically patterned on selective regions of the semiconductor is utilized. The metal is then evaporated and the unnecessary metal is lifted off. What remains on the surface of the substrate is a device pattern. Preferably, for a FET, the source and drain comprise the ohmic contacts.

In the next step, the process control monitors are patterned on the device 14. In the preferred process, these process control monitors include transmission line measurements (TLMs) and etch FETs. Process control monitors are TLMs and etch FETs. The TLMs are used to measure the contact resistance of the material during the subsequent ohmic alloy step. After the gate is written, the etch FETs are used to monitor the drain to source current change during the isolation etch.

The wafer is then placed in an oven where it is heated. Heating the wafer 16 causes the ohmic metal to diffuse and make contact with the device channel. Next, an e-beam writing system is used to write a gate in the PMMA layer 185. The undesired substrate material is then etched away to pattern a gate by evaporating a metal such as Ti/Pt/Au and lifting off.

In the next step of the preferred method, the active area of the device is protected 20. The protected area includes the electron beam gate area written during the previous step. In the preferred process, active area protection is accomplished via photoresist.

After the wafer is protected, all inactive device materials are etched away using either a wet chemical or dry etch. Isolation between adjacent devices is monitored during step 14. All types of etching schemes can be utilized since the problems normally associated with the ion implantation process and the removal of the photoresist are no longer present since the gate has already been written. Preferably, a wet chemical etch is utilized because it results in a cleaner manufacturing process.

In the preferred method of fabrication, the isolation etch is easier to accomplish than in previous methods since all ohmic contacts and the entire gate written reside in the same planer. Unlike in the mesa process, the isolation etch of the preferred method takes place after the gate has already been written. The leakage crossover problems associated with the mesa process are therefore eliminated. The device breakdown voltage, which under the mesa process is normally reduced, remains unaffected.

The last step of the preferred method of manufacturing involves overlaying a metal 22. This overlaying metal or interconnect metal (e.g. Ti/Pt/Au layer) interconnects different devices or completes various circuits. In the preferred embodiment, the overlaying metal covers and connects all planar device connecting pads.

Figure 2:
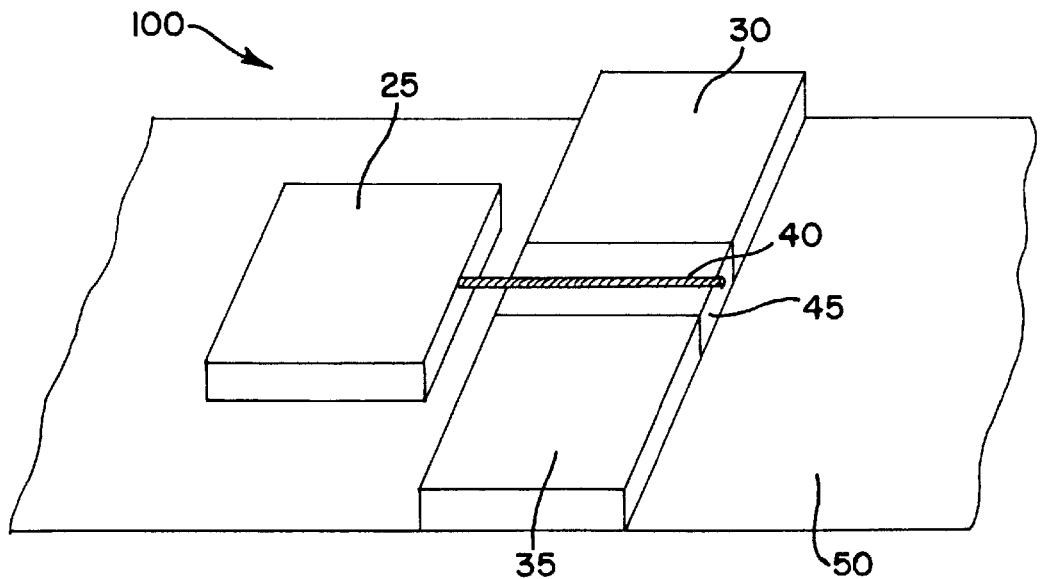
FIG. 2 shows an HEMT manufactured in accordance with the present invention.

FIG. 2 shows an HEMT manufactured in accordance with the present invention FIG. 2 shows a gate 25, a source 30, a drain 35, a gate feeder 40, Schottky layer 45 and a first semiconductor surface 50. As shown in FIG. 2, the source 30, the drain 35 and the gate 25 each reside in the same planar surface. Although not shown in FIG. 2, an overlaying metal or interconnect metal can be provided on top of the surfaces of the source 30 and drain 35. Leakage paths between any device interconnections and the FET channel are drastically reduced since the manufactured device as shown in FIG. 2 no longer has a mesa edge.

The described FET manufacturing process has several advantages. Because the novel planar process does not utilize ion implantation, the manufacturing yields are much higher than with previous methods. Yields of approximately 90% can be achieved along with an accompanying reduction in production time and cost. The isolation of devices fabricated via the preferred method will easily exceed 6 megaohms. Where devices with very low band gaps are manufactured, leakage paths between device interconnections and FET channels are reduced since the manufactured devices no longer have a mesa edge. This novel planar fabrication process will also greatly simplify fabrication and improve yield (lower the cost) of both low-noise and power HEMTs and monolithic microwave integrated circuits (MMICs). Additionally, the disclosed process reduces the need for capital intensive equipment normally associated with solid state device manufacturing and isolation, particularly the ion implantation process.

While several illustrative embodiments of the invention have been shown and described, numerous variations and alternative embodiments will occur to those skilled in the art. Such variations and alternate embodiments are contemplated, and can be made without departing from the spirit and scope of the invention as defined by the appended claims.

We claim:

1. A method of processing a semiconductor material device comprising:

providing a semiconductor substrate having a first surface;

patterning an ohmic metalization on said first surface of said semiconductor substrate;

lifting-off of said ohmic metalization;

isolating a plurality of process control monitors on said semiconductor surface;

alloying said ohmic metalization, said alloyed ohmic metalization defining planar metallic contacts;

writing a gate on said semiconductor surface; and isolating said semiconductor device after said step of writing said gate.

2. The method of claim 1 wherein an over layer is provided over said semiconductor surface, connecting all planar device connecting pads.

3. The method of claim 1, wherein said process control monitors include transmission line patterns (TLMs).

4. The method of claim 1, wherein said process control monitors include etch field effect transistors.

5. The method of claim 3, wherein said transmission line patterns measure contact resistance during said ohmic alloy step.

6. The method of claim 4, wherein said etch field effect transistors monitor drain current during said step of isolation.

7. The method of claim 1, wherein said process control monitors are isolated using a wet etch process.

* * * * *